United States Patent
Fujita et al.

(10) Patent No.: US 6,670,903 B2
(45) Date of Patent: Dec. 30, 2003

(54) A/D CONVERTER AND SOLID-STATE CAMERA

(75) Inventors: Kazuki Fujita, Hamamatsu (JP); Seiichiro Mizuno, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 0 days.

(21) Appl. No.: 10/343,016

(22) PCT Filed: Jul. 27, 2001

(86) PCT No.: PCT/JP01/06508
§ 371 (c)(1),
(2), (4) Date: Jan. 27, 2003

(87) PCT Pub. No.: WO02/11290
PCT Pub. Date: Feb. 7, 2002

(65) Prior Publication Data
US 2003/0179125 A1 Sep. 25, 2003

(30) Foreign Application Priority Data
Jul. 27, 2000 (JP) .......................... 2000-227467

(51) Int. Cl.[7] .......................... H03M 1/14; H03M 1/12; H04N 5/335
(52) U.S. Cl. .......................... 341/155; 341/158; 341/161
(58) Field of Search .......................... 341/155, 118, 341/124, 131, 158, 161

(56) References Cited

U.S. PATENT DOCUMENTS 5,841,310 A * 11/1998 Kalthoff et al. .............. 327/337
6,538,593 B2 * 3/2003 Yang et al. .................. 341/155
6,608,583 B1 * 8/2003 Konno ........................ 341/155

FOREIGN PATENT DOCUMENTS

| JP | 53-84451 | 7/1978 | .......... H03K/13/09 |
| JP | 56-19227 | 2/1981 | ............ H03K/3/18 |
| JP | 60-63683 | 4/1985 | ............. G06J/1/00 |
| JP | 63-19917 | 1/1988 | ............ H03M/1/14 |
| JP | 2000-32342 | 1/2000 | .......... H04N/5/335 |

OTHER PUBLICATIONS

Yuh–Min Lin et al., "A 13–b 2.5–MHz Self–Calibrated Pipelined A/D Converter in 3–μm CMOS", IEEE Journal of Solid–State Circuits, vol. 26, No. 4, pp. 628–636, Apr. 1991.

Steven Decker, et al., "A 256×256 CMOS Imaging Array with Wide Dynamic Range Pixels and Column–Parallel Digital Output", IEEE Journal of Solid–State Circuits, vol. 33, No. 12, pp. 2081–2091, Dec. 1998.

* cited by examiner

Primary Examiner—Peguy JeanPierre
(74) Attorney, Agent, or Firm—Morgan, Lewis & Bockius LLP

(57) ABSTRACT

A signal from a photodiode (PD) is supplied to an A/D converter circuit (30) through an integrator (10) and a switch circuit (20). An amplifier circuit (40) amplifies a residue in A/D conversion, and the amplified residue (analog value) is supplied to the A/D converter circuit (30) through the switch circuit (20) and converted to a digital value by the A/D converter circuit (30).

4 Claims, 6 Drawing Sheets

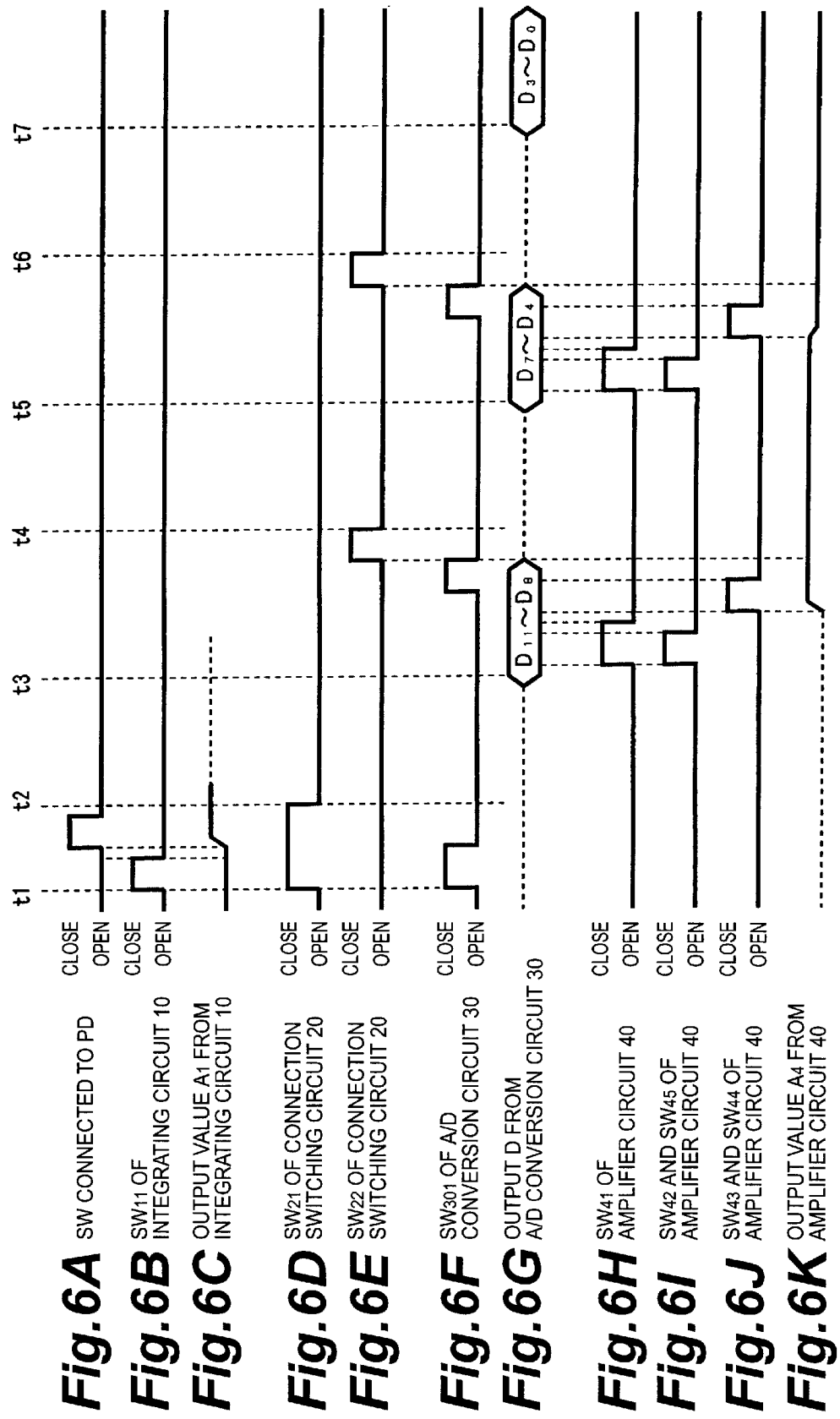

A/D CONVERTER AND SOLID-STATE CAMERA

TECHNICAL FIELD

The present invention relates to an A/D conversion apparatus which converts an analog value into a digital value, and a solid-state image sensing apparatus including the A/D conversion apparatus.

BACKGROUND ART

A solid-state image sensing apparatus comprises a plurality of photodetectors arrayed one- or two-dimensionally, and an integrating circuit which converts a current output from each photodetector into a voltage. In the solid-state image sensing apparatus, currents of values corresponding to incident light intensities are output from the respective photodetectors. Voltages of values corresponding to the current values are output from the integrating circuit. An incident light intensity distribution is obtained based on the voltage values to sense an image.

Some solid-state image sensing apparatuses further comprise an A/D conversion circuit which converts a voltage value (analog value) output from the integrating circuit into a digital value. In this case, the incident light intensity is obtained as a digital value and can undergo image processing by a computer or the like.

In general, demands have arisen for increasing the A/D conversion processing speed including that for the solid-state image sensing apparatus. For example, in an A/D conversion apparatus described in reference 1 (Yuh-Min Lee, et al., "A 13-b 2.5-MHz Self-Calibrated Pipelined A/D Converter In 3-$\mu$m CMOS", IEEE Journal of Solid-State Circuits, Vol. 26, No. 4, pp. 628–636 (1991)), a plurality of sets each made up of a sample-and-hold circuit, A/D conversion circuit, D/A conversion circuit, and amplifier circuit are cascade-connected.

In a given set of the A/D conversion apparatus, an analog value output from the sample-and-hold circuit is converted into a digital value by the A/D conversion circuit, and the digital value is converted into an analog value by the D/A conversion circuit. The difference between the analog values respectively output from the sample-and-hold circuit and D/A conversion circuit is amplified by the amplifier circuit. The amplified difference (analog value) is input to the sample-and-hold circuit of the next set. This A/D conversion apparatus increases the speed by pipeline processing.

In an A/D conversion apparatus described in reference 2 (Steven Decker, et al., "A 256×256 CMOS Imaging Array with Wide Dynamic Range Pixels and Column-Parallel Digital Output", IEEE Journal of Solid-State Circuits, Vol. 33, No. 12, pp. 2081–2091 (1998)), two sets each made up of a comparison circuit (1-bit A/D conversion circuit), amplifier circuit (amplification factor: 2), and addition circuit are arranged in a loop.

In a given set of this A/D conversion apparatus, an input analog value is converted into a 1-bit digital value by the comparison circuit, and the digital value is amplified twice by the amplifier circuit. A predetermined analog value is added to or subtracted from the analog value output from the amplifier circuit in accordance with a 1-bit digital value output from the comparison circuit. The resultant value is output to the next set.

The A/D conversion apparatus realizes a small circuit scale as a whole by downsizing the circuit scales of the comparison circuit, amplifier circuit, and addition circuit of each set and repetitively operating the two sets arranged in a loop.

DISCLOSURE OF THE INVENTION

The A/D conversion apparatus described in reference 1 achieves a high speed by the pipeline arrangement. As the number of bits of a digital value becomes larger, the circuit scale becomes larger. The A/D conversion apparatus must be equipped not only with the A/D conversion circuit but also with the D/A conversion circuit, which increases the circuit scale. Further, the precision of the obtained digital value is influenced by a D/A conversion error.

The A/D conversion apparatus described in reference 2 attains a small circuit scale as a whole by downsizing the scale of each circuit of each set and arranging the two sets in a loop. However, a signal passes through the number of sets of comparison circuits, amplifier circuits, and addition circuits corresponding to the number of bits of a digital value. The precision of the obtained digital value is greatly influenced by an error of each circuit of each set. If the operation characteristics of the comparison circuit, amplifier circuit, and addition circuit mismatch in each set, this mismatch also influences the precision of the obtained digital value.

The present invention has been made to overcome the conventional drawbacks, and has as its object to provide an A/D conversion apparatus with a small circuit scale and a small A/D conversion error, and a solid-state image sensing apparatus including the A/D conversion apparatus.

An A/D conversion apparatus according to the present invention is characterized in that a difference between a first analog value input to an A/D conversion circuit and a second analog value corresponding to a digital value output from the A/D conversion circuit is amplified, and the amplified difference is fed back as a third analog value to an input terminal of the A/D conversion circuit after input of the first analog value.

The A/D conversion apparatus is characterized by comprising a connection switching circuit which selectively inputs either of the first and third analog values to the A/D conversion circuit.

In other words, the A/D conversion apparatus comprises (A) a connection switching circuit which has first, second, and third terminals and connects either the first or second terminal to the third terminal, (B) an A/D conversion circuit which receives an analog value from the third terminal of the connection switching circuit, converts the analog value to a digital value, and outputs the digital value, (C) an amplifier circuit which amplifies a difference between an analog value corresponding to the digital value output from the A/D conversion circuit and the analog value input to the A/D conversion circuit, and outputs the amplified analog value to the second terminal of the connection switching circuit, and (D) control means for controlling switching of connection between the first, second, and third terminals of the connection switching circuit.

In the A/D conversion apparatus, an analog value input to the first terminal of the connection switching circuit is input to the A/D conversion circuit via the third terminal under the control of the control means. The analog value is converted into a digital value by the A/D conversion circuit, and the digital value is output from the A/D conversion circuit.

To obtain a digital value of a larger number of bits, the difference between an analog value corresponding to the digital value output from the A/D conversion circuit and an analog value input to the A/D conversion circuit is amplified by the amplifier circuit. The amplified analog value is input to the A/D conversion circuit via the second and third terminals of the connection switching circuit. The analog value is converted into a digital value (corresponding to lower bits than a previously output digital value) by the A/D conversion circuit. The digital value is output from the A/D conversion circuit. This operation may be repeated.

The A/D conversion apparatus according to the present invention is characterized in that the A/D conversion circuit outputs the digital value of n bits (n is an integer of 1 or more), and the amplifier circuit amplifies the difference by $2^n$. In this case, A/D conversion processing is most efficiently performed.

A solid-state image sensing apparatus which senses an object is characterized by comprising (A) a photodetector which outputs a current of a value corresponding to an incident light intensity, (B) an integrating circuit which receives and integrates the current output from the photodetector, and outputs a voltage of a value corresponding to the current value, and (C) the A/D conversion apparatus which receives the voltage output from the integrating circuit and converts the voltage value into a digital value.

According to the solid-state image sensing apparatus, a current of a value corresponding to the incident light intensity in the photodetector is output from the photodetector and integrated by the integrating circuit. A voltage of a value corresponding to the current value is output from the integrating circuit. The voltage value (analog value) output from the integrating circuit is converted into a digital value by the A/D conversion apparatus.

BRIEF DESCRIPTION OF DRAWINGS

FIGS. 6A, 6B, 6C, 6D, 6E, 6F, 6G, 6H, 6I, 6J, and 6K are timing charts for explaining the operation of the solid-state image sensing apparatus 1.

BEST MODE OF CARRYING OUT THE INVENTION

Figure 1:
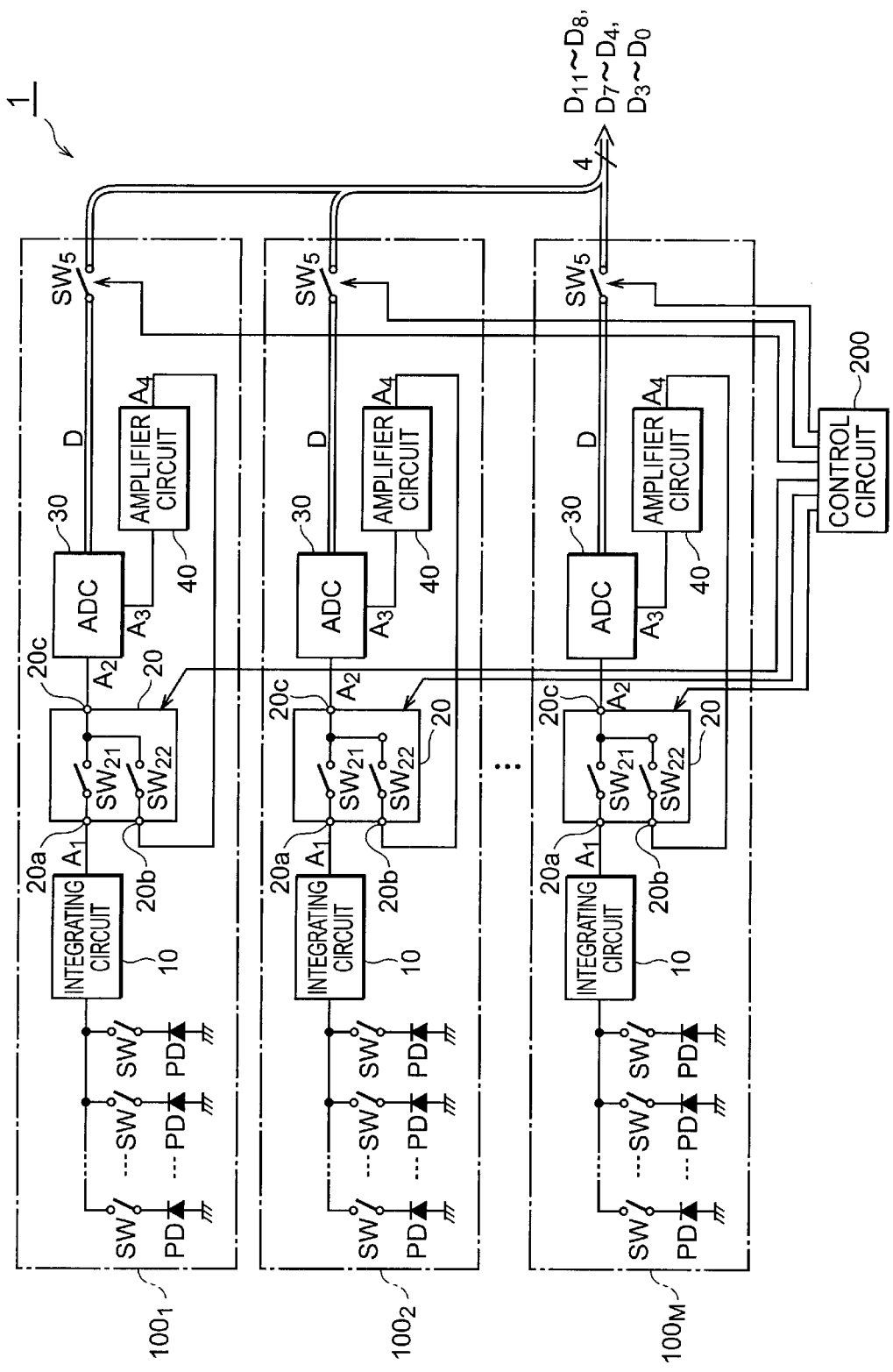
FIG. 1 is a block diagram showing a solid-state image sensing apparatus 1 including an A/D conversion apparatus according to an embodiment.

An embodiment of the present invention will be described in detail below with reference to the accompanying drawings. In the description of the drawings, the same reference numerals denote the same parts, and a repetitive description thereof will be omitted.

FIG. 1 is a block diagram showing a solid-state image sensing apparatus 1 including an A/D conversion apparatus according to the embodiment. The solid-state image sensing apparatus 1 comprises M (M is an integer of 1 or more) units $100_1$ to $100_M$ and a control circuit 200. The units $100_m$ (m is an arbitrary integer of 1 (inclusive) to M (inclusive)) have the same arrangement. Each unit comprises a plurality of sets of photodiodes (photodetectors) PD and switches SW, an integrating circuit 10, a connection switching circuit 20, an A/D conversion circuit 30, an amplifier circuit 40, and a switch $SW_5$.

The A/D conversion apparatus according to the embodiment includes the connection switching circuit 20, A/D conversion circuit 30, amplifier circuit 40, and control circuit 200.

In each unit $100_m$, each photodiode PD has an anode terminal grounded, and a cathode terminal connected to the input terminal of the integrating circuit 10 via a corresponding switch SW. The photodiode PD outputs a current corresponding to the is incident light intensity to the integrating circuit 10. The integrating circuit 10 of each unit $100_m$ receives and integrates the current output from the photodiode PD, and outputs a voltage of a value $A_1$ corresponding to the current value to the connection switching circuit 20.

The connection switching circuit 20 of each unit $100_m$ has first, second, and third terminals 2a, 2b, and 20c. A switch $SW_{21}$ is interposed between the first and third terminals 20a and 20c, whereas a switch $SW_{22}$ is interposed between the second and third terminals 20b and 20c.

The first terminal 20a is connected to the output terminal of the integrating circuit 10; the second terminal 20b, to the output terminal of the amplifier circuit 40; and the third terminal 20c, to the input terminal of the A/D conversion circuit 30. The connection switching circuit 20 closes either the switch $SW_{21}$ or $SW_{22}$ to connect the output terminal of either the integrating circuit 10 or amplifier circuit 40 to the input terminal of the A/D conversion circuit 30.

The A/D conversion circuit 30 of each unit $100_m$ receives a voltage output from the third terminal 20c of the connection switching circuit 20. A voltage value (analog value) $A_2$ input to the A/D conversion circuit 30 is the voltage value $A_1$ output from the integrating circuit 10 or a voltage value $A_4$ output from the amplifier circuit 40 in accordance with opening/closing of the switches $SW_{21}$ and $SW_{22}$ of the connection switching circuit 20.

The A/D conversion circuit 30 converts the input voltage value $A_2$ into an n-bit (n is an integer of 1 or more) digital value D, and outputs the digital value D to the switch $SW_5$. The A/D conversion circuit 30 outputs an analog value $A_3$ to the amplifier circuit 40 in accordance with the difference between an analog value $A_0$ corresponding to the digital value D output from the A/D conversion circuit 30 and the analog value $A_2$ input to the A/D conversion circuit 30.

The amplifier circuit 40 of each unit $100_m$ amplifies the difference between the analog value corresponding to the digital value output from the A/D conversion circuit 30 and the analog value $A_2$ input to the A/D conversion circuit 30 on the basis of the analog value $A_3$ output from the A/D conversion circuit 30. The amplifier circuit 40 outputs the amplified analog value $A_4$ to the second terminal 20b of the connection switching circuit 20.

One terminal of the switch $SW_5$ of each unit $100_m$ is connected to the output terminal of the A/D conversion circuit 30, and its other terminal is shared with the remaining switches $SW_5$. By sequentially closing the switches $SW_5$, digital values D output from corresponding A/D conversion circuits 30 are output to the outside of the units $100_m$.

The control circuit 200 controls the overall operation of the solid-state image sensing apparatus 1. The control circuit 200 controls opening/closing of the switch $SW_5$ and the switches in the connection switching circuit 20. In addition, the control circuit 200 controls opening/closing of switches between the photodiodes PD and the integrating circuit 10, switches (not shown) in the A/D conversion circuit 30, and switches (not shown) in the amplifier circuit 40.

Figure 2:
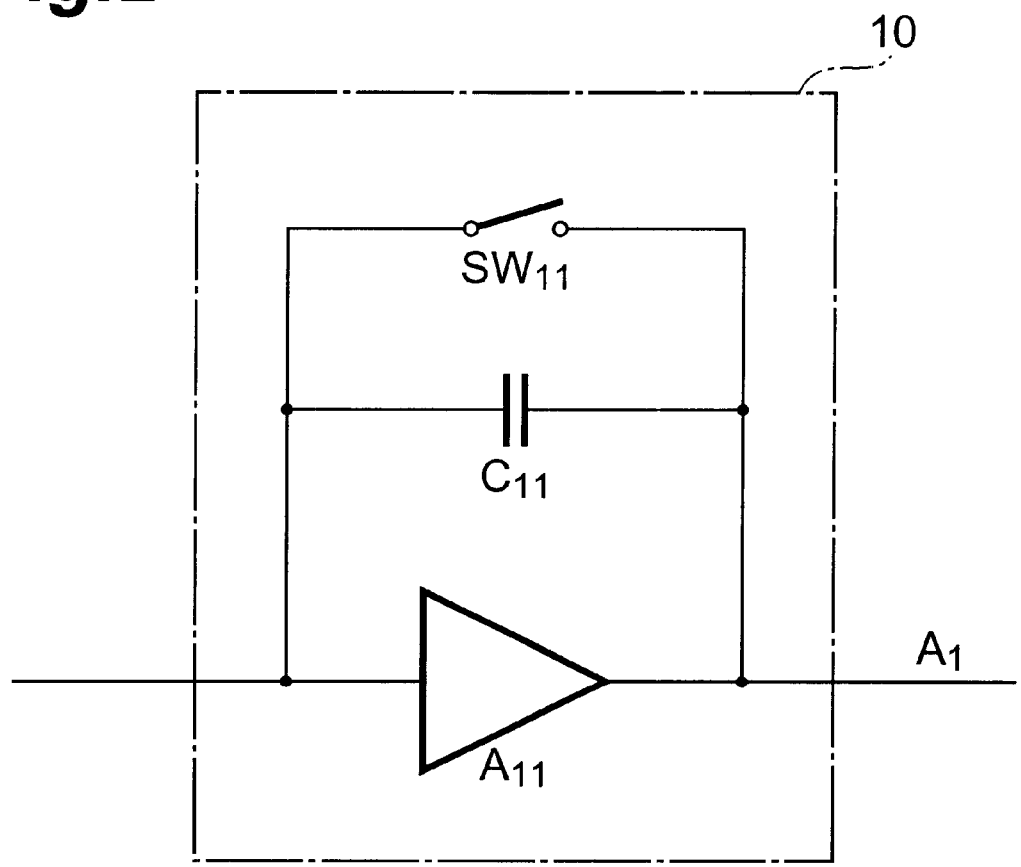
FIG. 2 is a circuit diagram showing an integrating circuit 10.

FIG. 2 is a circuit diagram showing the integrating circuit 10. In the integrating circuit 10, an amplifier $A_{11}$, capacitor $C_{11}$, and switch $SW_{11}$ are parallel-arranged between the input and output terminals. The capacitor $C_{11}$ is interposed between the input and output terminals of the amplifier $A_{11}$, and accumulates a current, i.e., charges input to the input terminal when the switch $SW_{11}$ is open.

The switch $SW_{11}$ is interposed between the input and output terminals of the amplifier $A_{11}$. When the switch $SW_{11}$ is open, charges are accumulated in the capacitor $C_{11}$; when the switch $SW_{11}$ is closed, charges accumulated in the capacitor $C_{11}$ are reset.

Figure 3:
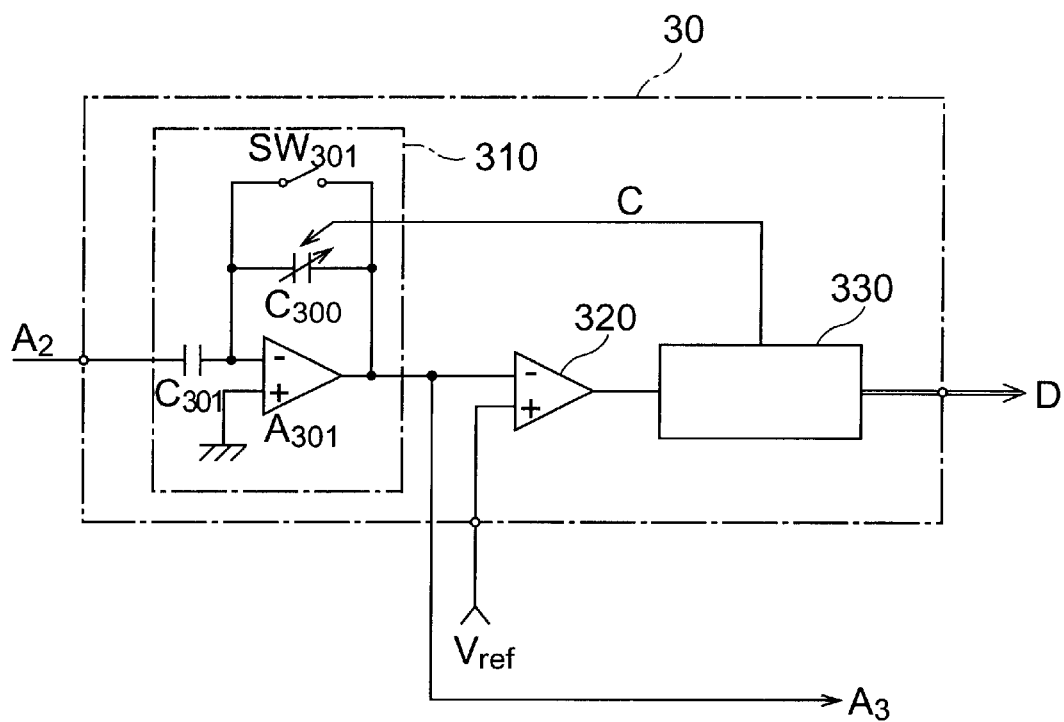
FIG. 3 is a circuit diagram showing an A/D conversion circuit 30.

FIG. 3 is a circuit diagram showing the A/D conversion circuit 30. The A/D conversion circuit 30 comprises a variable-capacitance integrating circuit 310, comparison circuit 320, and capacitance controller 330. The variable-capacitance integrating circuit 310 comprises a capacitor $C_{301}$, amplifier $A_{301}$, variable capacitance section $C_{300}$, and switch $SW_{301}$.

The amplifier $A_{301}$ receives a voltage value (analog value) $A_2$ output from the third terminal 20c of the connection switching circuit 20 at its an inverting input terminal via the capacitor $C_{301}$. The non-inverting input terminal of the amplifier $A_{301}$ is grounded. The variable capacitance section $C_{300}$ has a variable capacitance which can be controlled. The variable capacitance section $C_{300}$ is interposed between the inverting input terminal and output terminal of the amplifier $A_{301}$, and accumulates charges in accordance with the input voltage value $A_2$.

The switch $SW_{301}$ is interposed between the inverting input terminal and output terminal of the amplifier $A_{301}$. When the switch $SW_{301}$ is open, charges are accumulated in the variable capacitance section $C_{300}$; when the switch $SW_{301}$ is closed, charges accumulated in the variable capacitance section $C_{300}$ are reset. The variable-capacitance integrating circuit 310 receives the voltage value $A_2$ output from the connection switching circuit 20, integrates the voltage value $A_2$ in accordance with the capacitance of the variable capacitance section $C_{300}$, and outputs a voltage as the integration result.

The comparison circuit 320 receives the voltage output from the variable-capacitance integrating circuit 310 at its inverting input terminal, and inputs a predetermined reference voltage value $V_{ref}$ to a non-inverting input terminal. The comparison circuit 320 compares the two voltage values, and outputs a signal representing the comparison result. The capacitance controller 330 receives a signal output from the comparison circuit 320, and outputs a capacitance designation signal C for controlling the capacitance of the variable capacitance section $C_{300}$ on the basis of the signal. If the voltage value and reference voltage value $V_{ref}$ are determined based on this signal to coincide with each other at a predetermined resolution, the capacitance controller 330 outputs a digital value D corresponding to the capacitance value of the variable capacitance section $C_{300}$.

A voltage output from the variable-capacitance integrating circuit 310 to the comparison circuit 320 is also output as a voltage value $A_3$ to the amplifier circuit 40. The voltage value $A_3$ is obtained by adding the reference voltage value $V_{ref}$ to the difference between the analog value $A_0$ corresponding to the digital value D output from the A/D conversion circuit 30 and the analog value $A_2$ input to the A/D conversion circuit 30 ($A_2-A_0+V_{ref}$)

Figure 4:
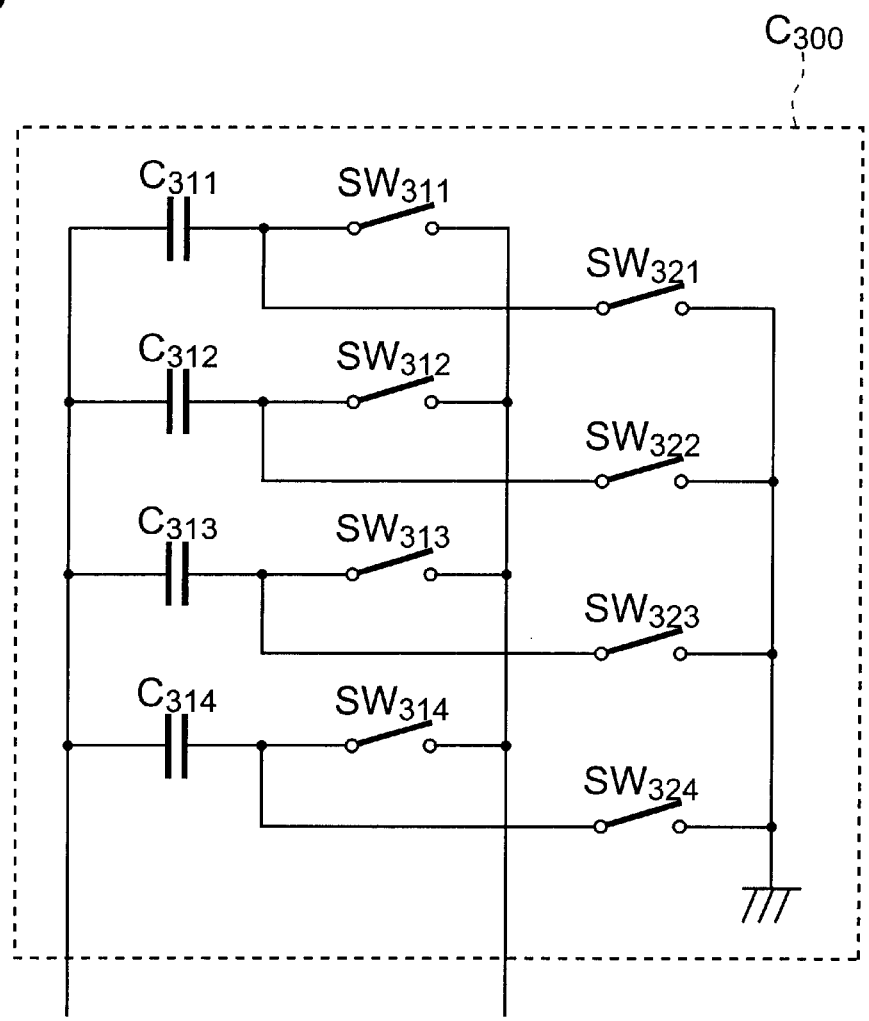
FIG. 4 is a circuit diagram showing a variable capacitance section $C_{300}$ of the A/D conversion circuit 30.

FIG. 4 is a circuit diagram showing the variable capacitance section $C_{300}$ of the A/D conversion circuit 30. The variable capacitance section $C_{300}$ comprises capacitors $C_{311}$ to $C_{314}$, switches $SW_{311}$ to $SW_{314}$, and switches $SW_{321}$ to $SW_{324}$. The capacitor $C_{31n}$ and switch $SW_{31n}$ are cascade-connected to each other, and interposed between the inverting input terminal and output terminal of the amplifier $A_{301}$. The switch $SW_{32n}$ is interposed between the ground, and the node between the capacitor $C_{31n}$ and the switch $SW_{31n}$ (n=1 to 4).

The switches $SW_{311}$ to $SW_{314}$ and $SW_{321}$ to $SW_{324}$ are opened/closed on the basis of the capacitance designation signal C output from the capacitance controller 330. The capacitance values of the capacitors $C_{301}$ and $C_{311}$ to $C_{314}$ satisfy $$C_{311}=2C_{312}=4C_{313}=8C_{314} \tag{1a}$$

$$C_{301}=15C_{314} \tag{1b}$$

The capacitance value of the variable capacitance section $C_{300}$ depends on the opening/closing states of the switches $SW_{311}$ to $SW_{314}$ and $SW_{321}$ to $SW_{324}$. More specifically, when all the switches $SW_{311}$ to $SW_{314}$ are closed and all the switches $SW_{321}$ to $SW_{324}$ are open, the capacitance value of the variable capacitance section $C_{300}$ is a maximum value of $15C_{314}$.

If only the switch $SW_{314}$ out of the switches $SW_{311}$ to $SW_{314}$ is open and only the switch $SW_{324}$ out of the switches $SW_{321}$ to $SW_{324}$ is closed, the capacitance value of the variable capacitance section $C_{300}$ is $14C_{314}$. If only the switch $SW_{313}$ out of the switches $SW_{311}$ to $SW_{314}$ is open and only the switch $SW_{323}$ out of the switches $SW_{321}$ to $SW_{324}$ is closed, the capacitance value of the variable capacitance section $C_{300}$ is $13C_{314}$.

If only the switches $SW_{314}$ and $SW_{313}$ out of the switches $SW_{311}$ to $SW_{314}$ are open and only the switches $SW_{324}$ and $SW_{323}$ out of the switches $SW_{321}$ to $SW_{324}$ are closed, the capacitance value of the variable capacitance section $C_{300}$ is $12C_{314}$. In this way, the capacitance value of the variable capacitance section $C_{300}$ takes any value of $k \cdot C_{314}$ (k is an integer of 0 (inclusive) to 15 (inclusive)) depending on opening/closing of the switches $SW_{311}$ to $SW_{314}$ and $SW_{321}$ to $SW_{324}$.

In the A/D conversion circuit 30, the opening/closing state of each switch of the variable capacitance section $C_{300}$ (i.e., the capacitance value of the variable capacitance section $C_{300}$) is controlled by the capacitance controller 330 so as to minimize the absolute value of the difference between the reference voltage value $V_{ref}$ and an output voltage value from the variable-capacitance integrating circuit 310 on the basis of an output value from the comparison circuit 320 in a feedback loop constituted by the variable-capacitance integrating circuit 310, comparison circuit 320, and capacitance controller 330.

When the absolute value of the difference is minimized, a 4-bit digital value D is output from the capacitance controller 330 in accordance with the opening/closing states of the four switches $SW_{311}$ to $SW_{314}$ of the variable capacitance section $C_{300}$. Further, a voltage value $A_3$ ($=A_2-A_0+V_{ref}$) is output from the variable capacitance section $C_{300}$.

Figure 5:
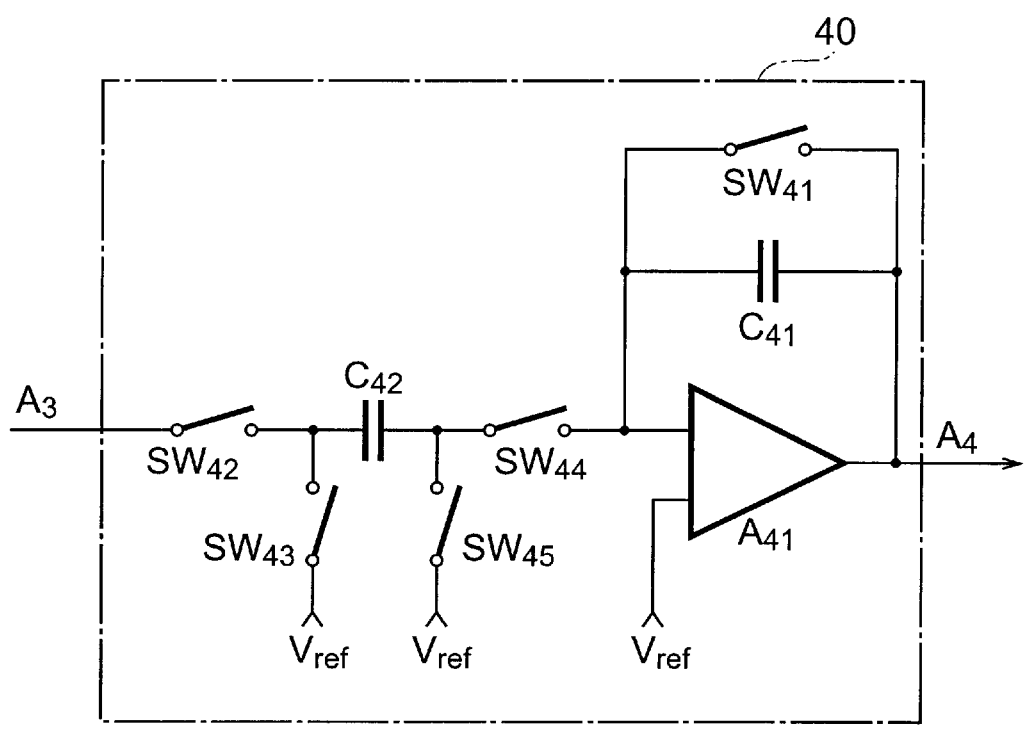
FIG. 5 is a circuit diagram showing an amplifier circuit 40.

FIG. 5 is a circuit diagram showing the amplifier circuit 40. In the amplifier circuit 40, a switch $SW_{42}$, capacitor $C_{42}$, switch $SW_{44}$, and amplifier $A_{41}$ are series-connected between input and output terminals. The node between the switch $SW_{42}$ and the capacitor $C_{42}$ receives a reference voltage value $V_{ref}$ via a switch $SW_{43}$. The node between the capacitor $C_{42}$ and the switch $SW_{44}$ receives the reference voltage value $V_{ref}$ via a switch $SW_{45}$.

A capacitor $C_{41}$ and switch $SW_{41}$ are parallel-connected between the inverting input terminal and output terminal of the amplifier $A_{41}$. The reference voltage value $V_{ref}$ is supplied to the non-inverting input terminal of the amplifier $A_{41}$.

The reference voltage value $V_{ref}$ in the amplifier circuit 40 is equal to the reference voltage value $V_{ref}$ input to the non-inverting input terminal of the comparison circuit 320 of the A/D conversion circuit 30.

The capacitor $C_{41}$ is interposed between the inverting input terminal and output terminal of the amplifier $A_{41}$. When the switch $SW_{41}$ is open, the capacitor $C_{41}$ accumulates a current, i.e., charges input from the input terminal via the capacitor $C_{42}$. The switch $SW_{41}$ is interposed between the inverting input terminal and output terminal of the amplifier $A_{41}$. When the switch $SW_{41}$ is open, charges are accumulated in the capacitor $C_{41}$; when the switch $SW_{41}$ is closed, charges accumulated in the capacitor $C_{41}$ are reset.

The amplifier circuit 40 receives the voltage value $A_3$ output from the A/D conversion circuit 30, and subtracts the reference voltage value $V_{ref}$ from the voltage value $A_3$ in accordance with opening/closing of the switches $SW_{42}$ to $SW_{45}$ at predetermined timings. The amplifier circuit 40 calculates the difference $(A_2-A_0)$ between the analog value $A_0$ corresponding to the digital value D output from the A/D conversion circuit 30 and the analog value $A_2$ input to the A/D conversion circuit 30. The amplifier circuit 40 amplifies this difference by a gain G corresponding to the ratio of the capacitance values of the capacitors $C_{42}$ and $C_{41}$. The amplifier circuit 40 outputs a voltage value $A_4$ $(=G \cdot (A_2-A_0))$ as the amplification result to the second terminal 20b of the connection switching circuit 20.

When the A/D conversion circuit 30 outputs a 4-bit digital value D, A/D conversion processing becomes efficient for a gain G of 16 $(=2^4)$ in the amplifier circuit 40.

The operation of the solid-state image sensing apparatus 1 including the A/D conversion apparatus according to the embodiment will be explained. The solid-state image sensing apparatus 1 operates under the control of the control circuit 200. A case where the incident light intensity to each photodiode PD is output as a 12-bit digital value will be described.

FIGS. 6A, 6B, 6C, 6D, 6E, 6F, 6G, 6H, 6I, 6J, and 6K are timing charts for explaining the operation of the solid-state image sensing apparatus 1.

At time t1, the switch $SW_{11}$ of the integrating circuit 10 closes (FIG. 6B), the capacitor $C_{11}$ is discharged, and the voltage value $A_1$ output from the integrating circuit 10 is reset (FIG. 6C). In the interval between time t1 and time t2, the switch $SW_{21}$ of the connection switching circuit 20 is closed while the switch $SW_{22}$ is open (FIGS. 6D and 6E). The switch $SW_{301}$ of the variable-capacitance integrating circuit 310 of the A/D conversion circuit 30 is closed, and the variable capacitance section $C_{300}$ is discharged (FIG. 6F). All the switches $SW_{311}$ to $SW_{314}$ are closed, and all the switches $SW_{321}$ to $SW_{324}$ are opened.

The switch $SW_{11}$ of the integrating circuit 10 then opens (FIG. 6B), and the switch $SW_{301}$ of the variable-capacitance integrating circuit 310 of the A/D conversion circuit 30 opens (FIG. 6F). After the switch $SW_{11}$ of the integrating circuit 10 opens, the switch SW between the photodiode PD and the integrating circuit 10 temporarily closes and then opens (FIG. 6A). At time t2, the switch $SW_{21}$ of the connection switching circuit 20 opens (FIG. 6D).

In this manner, in the interval between time t1 and time t2, an amount of charges corresponding to the incident light intensity in the photodiode PD is accumulated in the capacitor $C_{11}$ of the integrating circuit 10. A voltage having the corresponding value $A_1$ is output from the integrating circuit 10, and input to the A/D conversion circuit 30 via the connection switching circuit 20. Charges corresponding to the voltage value $A_1$ $(=A_2)$ are accumulated in the variable capacitance section $C_{300}$ of the variable-capacitance integrating circuit 310 of the A/D conversion circuit 30.

In the interval between time t2 and time t3, the A/D conversion circuit 30 executes A/D conversion processing. More specifically, the operation of the feedback loop formed from the variable-capacitance integrating circuit 310, comparison circuit 320, and capacitance controller 330 opens/closes each switch of the variable capacitance section $C_{300}$ of the variable-capacitance integrating circuit 310. The input voltage value (analog value) $A_2$ is converted into a 4-bit digital value $(D_{11}$ to $D_8)$, which is output. The variable-capacitance integrating circuit 310 of the A/D conversion circuit 30 outputs the voltage value $A_3$ corresponding to the difference between the voltage value $A_0$ corresponding to the digital value D and the input voltage value $A_2$.

In the interval between time t3 and time t4, the switches $SW_5$ of the respective units $100_m$ sequentially close. Digital values D output from the A/D conversion circuits 30 of the respective units $100_m$ are sequentially output (FIG. 6G).

After time t3, the switch $SW_{41}$ of the amplifier circuit 40 is closed (FIG. 6H), the capacitor $C_{41}$ is discharged, and the voltage value $A_4$ output from the amplifier circuit 40 is reset. The switches $SW_{45}$ and $SW_{42}$ of the amplifier circuit 40 temporarily close and then open (FIG. 6I). After the switch $SW_{41}$ opens, the switches $SW_{43}$ and $SW_{44}$ temporarily close and then open (FIG. 6J). The switch $SW_{301}$ of the variable-capacitance integrating circuit 310 of the A/D conversion circuit 30 temporarily closes and then opens (FIG. 6F). The switch $SW_{22}$ of the connection switching circuit 20 temporarily closes and then opens (FIG. 6E).

In the interval between time t3 and time t4, the voltage value $A_3$ output from the A/D conversion circuit 30 is amplified 16 times by the amplifier circuit 40. The voltage value $A_4$ is output as the amplification result from the amplifier circuit 40, and input to the A/D conversion circuit 30 via the connection switching circuit 20 (FIG. 6K). Charges corresponding to the voltage value $A_4$ $(=A_2)$ are accumulated in the variable capacitance section $C_{300}$ of the variable-capacitance integrating circuit 310 of the A/D conversion circuit 30.

In the interval between time t4 and time t5, the A/D conversion circuit 30 performs A/D conversion processing. The operation of the A/D conversion circuit 30 at this interval is the same as the operation in the interval between time t2 and time t3. Note that the voltage value $A_2$ input to the A/D conversion circuit 30 is the voltage value $A_4$ output from the amplifier circuit 40, which is obtained by multiplying by the gain G $(=2^4=16)$ the difference $(A_2-A_0)$ between the analog value $A_0$ corresponding to the digital value D output from the A/D conversion circuit 30 and the analog value $A_2$ input to the A/D conversion circuit 30 in the interval between time t3 and time t4.

That is, A/D conversion processing in the A/D conversion circuit 30 in the interval between time t4 and time t5 processes any residual in the preceding A/D conversion processing in the interval between time t2 and time t3. Thus, a digital value $(D_7$ to $D_4)$ output from the A/D conversion circuit 30 after time t5 corresponds to lower 4 bits than the preceding digital value $(D_{11}$ to $D_8)$ output after time t3.

The subsequent operation is also the same. More specifically, the operation in the interval between time t5 and time t6 is the same as that in the interval between time t3 and time t4. The operation in the interval between time t6 and time t7 is the same as that in the interval between time t4 and time t5. A digital value $(D_3$ to $D_0)$ output from the A/D conversion circuit 30 after time t7 corresponds to lower 4 bits than the preceding digital value $(D_7$ to $D_4)$ output after time t5.

Even the A/D conversion circuit 30 which converts an analog value into a 4-bit digital value can obtain a 4k-bit (k is an integer of 2 or more) by arranging the connection switching circuit 20 and amplifier circuit 40, if necessary, inputting the residual of A/D conversion processing in the A/D conversion circuit 30 to the A/D conversion circuit 30 again, and repetitively performing A/D conversion processing.

In this embodiment, the A/D conversion circuit 30 outputs a 4-bit digital value though the number of bits of an output digital value is variable. This embodiment can omit a conventional D/A conversion circuit, and is suitable for arraying many units $100_1$ to $100_M$ with a small circuit scale.

This embodiment need not adopt any D/A conversion circuit, the precision of an obtained digital value is free from any influence of a D/A conversion error, and the A/D conversion error is small. This embodiment executes A/D conversion processing using charge conservation and increases the number of bits, which also reduces the A/D conversion error.

For example, when a moving picture must be sensed at a low precision but a high speed in the use of the solid-state image sensing apparatus 1 according to the embodiment, the moving picture is sensed by decreasing the repetitive number of times of A/D conversion processing under the control of the control circuit 200. When a still picture must be sensed at a low speed but a high precision, the still picture is sensed by increasing the repetitive number of times of A/D conversion processing under the control of the control circuit 200. By controlling the repetitive number of times of A/D conversion, as needed, the image sensing operation speed or precision can be increased.

The present invention is not limited to the above-described embodiment, and can be variously modified. For example, in the description of the operation according to the embodiment, a 12-bit digital value is obtained by repeating 4-bit A/D conversion processing three times. Alternatively, a 4-bit digital value may be obtained by performing A/D conversion processing only once, an 8-bit digital value may be obtained by performing A/D conversion processing twice, or a 16-bit digital value may be obtained by performing A/D conversion processing four times. In general, a 4k-bit digital value can be obtained by performing A/D conversion processing k times.

In the above embodiment, the A/D conversion circuit 30 outputs a 4-bit digital value by one A/D conversion processing. The A/D conversion circuit 30 may output a digital value of a different number of bits.

Industrial Applicability

The present invention can be applied to an A/D conversion apparatus which converts an analog value into a digital value, and a solid-state image sensing apparatus including the A/D conversion apparatus.

What is claimed is:

1. An A/D conversion apparatus in which a difference between a first analog value input to an A/D conversion circuit and a second analog value corresponding to a digital value output from the A/D conversion circuit is amplified, and the amplified difference is fed back as a third analog value to an input terminal of the A/D conversion circuit after input of the first analog value, characterized by comprising:

a variable-capacitance integrating circuit which accumulates charges in accordance with the input first analog signal;

a comparison circuit which receives an output from said variable-capacitance integrating circuit and a reference voltage value;

a capacitance controller which controls a capacitance value of said variable-capacitance integrating circuit, sets an amount corresponding to the capacitance value as the digital value, and when an output signal from said comparison circuit represents that the output from said variable-capacitance integrating circuit and the reference voltage value coincide with each other at a predetermined resolution, outputs the digital value; and an amplifier circuit which amplifies the output from said variable-capacitance integrating circuit that represents the difference between the first and second analog values after output of the digital value, and feeds the amplified output as the third analog value to the input terminal of the A/D conversion circuit.

2. An A/D conversion apparatus according to claim 1, characterized by comprising a connection switching circuit which selectively inputs either of the first and third analog values to the A/D conversion circuit.

3. An A/D conversion apparatus according to claim 1, characterized in that the A/D conversion circuit outputs the digital value of n bits (n is an integer of not less than 1), and a factor of the amplification is $2^n$.

4. A solid-state image sensing apparatus comprising the A/D conversion apparatus defined in claim 1, characterized in that an output from an integrating circuit connected to a plurality of photodetectors is input as the first analog value to the A/D conversion circuit.

* * * * *